(12) United States Patent
Yoshida

(10) Patent No.: US 7,541,798 B2
(45) Date of Patent: Jun. 2, 2009

(54) SEMICONDUCTOR TEST APPARATUS AND PERFORMANCE BOARD

(75) Inventor: Kenji Yoshida, Tokyo (JP)

(73) Assignee: Advantest Corp., Tokyo (JP)

( * ) Notice: Subject to any disclaimer, the term of this patent is extended or adjusted under 35 U.S.C. 154(b) by 257 days.

(21) Appl. No.: 11/598,956

(22) Filed: Nov. 14, 2006

(65) Prior Publication Data

US 2007/0126455 A1 Jun. 7, 2007

(30) Foreign Application Priority Data

Nov. 14, 2005 (JP) ............................. 2005-328600

(51) Int. Cl.
G01R 19/00 (2006.01)
(52) U.S. Cl. .................. 324/76.11; 324/158.1; 324/500
(58) Field of Classification Search ............. 324/76.11, 324/158, 1, 765
See application file for complete search history.

(56) References Cited

U.S. PATENT DOCUMENTS 5,945,823 A * 8/1999 Noda ....................... 324/158.1

FOREIGN PATENT DOCUMENTS

| JP | H05-56460 | 3/1993 |
| JP | 2002-077951 | 3/2002 |

* cited by examiner

*Primary Examiner*—Vincent Q Nguyen
(74) *Attorney, Agent, or Firm*—Muramatsu & Associates

(57) ABSTRACT

A gain of a buffer provided on a performance board of a semiconductor test apparatus can be adjusted for testing image sensors with high accuracy. The performance board includes buffers for driving cables, and switches for inputting either a measurement signal from a device under measurement or a reference signal output from a reference signal generator. During calibration, the switches are turned to terminals to which the reference signal is input, such that the reference signal is applied to the buffers. Then, the gains of the buffers are corrected so that the output of an analog capture board has a desired value.

5 Claims, 4 Drawing Sheets

SEMICONDUCTOR TEST APPARATUS AND PERFORMANCE BOARD

BACKGROUND OF THE INVENTION

1. Field of the Invention

The present invention relates to a semiconductor test's apparatus (image sensor tester) for carrying out a performance test of a CCD or a CMOS constituting an image sensor and to a performance board provided in this semiconductor test apparatus. More particularly, it relates to a semiconductor test apparatus and a performance board suitable to correct the gain, etc. of a buffer provided to drive a cable connected between the performance board and a capture board.

2. Description of the Related Art

An image sensor is a device which measures the width and length of an object by use of an image sensor element having aligned photoelectric elements for converting a quantity of light into an electric signal.

This image sensor includes a CCD image sensor and a CMOS image sensor.

The CCD image sensor achieves a transfer by use of a circuit element called a charge coupled device (CCD) in order to read an electric charge generated from light by a light receiving element, when converting an image into an electric signal.

On the other hand, the CMOS image sensor is a solid-state image sensing device using a complementary metal-oxide semiconductor (CMOS), and is characterized by having an amplifier for each unit cell to enable the suppression of the generation of electric noise due to the reading of an optically corrected electric signal converted into light.

Meanwhile, in manufacturers of the image sensors, a performance test is carried out using an image sensor tester in order to check whether a manufactured image sensor has desired performance.

Various improvements have heretofore been proposed for this image sensor tester, for example, by Japanese Patent Publication Laid-open No. 5-56460 and Japanese Patent Publication Laid-open No. 2002-99751.

Here, the configuration of the image sensor tester will be described with reference to FIG. 3. FIG. 3 is a block diagram showing the configuration of the image sensor tester.

When a CCD element which is one of the image sensors is tested, an analog signal of an analog system 110 of a CCD driving unit and a timing signal from a timing system 120 of the CCD driving unit are supplied to a CCD element under test mounted on a performance board 130. An output (measurement signal) of the CCD element under test is converted from an analog signal to a digital signal by an A/D converter 141 of an analog capture board 140, and once loaded into an image data memory 150 of an image processing unit. The data loaded into the image data memory 150 is processed by an image processing unit 160, and a result of the processing is stored in an output memory 170. A synchronization signal of a television signal is generated in a synchronization signal generating unit 180, and this synchronization signal is supplied to a television monitor 190, and the data is read from the output memory 170 in synchronization with the synchronization signal and then supplied to the television monitor 190 on which the data is shown.

Such an operation makes it possible to carry out the performance test of the analog output of the CCD element.

When such a performance test of the CCD element is carried out, it is necessary to perform calibration in the image sensor tester to correct the gain of the amplifier in the analog capture board.

A configuration for performing this calibration will be described with reference to FIG. 4.

As shown in FIG. 4, in the performance board 130 of an image sensor tester 100, buffers 131-1 to 131-n are connected to analog output terminals of CCD elements (devices under measurement).

The buffers 131-1 to 131-n drive cables 200-1 to 200-n connected between the performance board 130 (measurement signal output terminals 132-1 to 132-n) and analog capture boards 140-1 to 140-n (measurement signal input terminals 142-1 to 142-n). The reason is that analog output lines of the devices under measurement have such high output impedances that the cables 200-1 to 200-n can not be driven, which needs to be compensated for.

On the other hand, the analog capture boards 140 (CH1 to CHn) comprise the measurement signal input terminals 142-1 to 142-n to which the measurement signals from the devices under measurement are input, amplifiers (amplifier circuits) 143-1 to 143-n for amplifying the input measurement signals, and A/D converters (ADCs) 141-1 to 141-n for the analog-to-digital conversion of the measurement signals. Thus, the measurement signals output from the devices under measurement can be amplified, analog-to-digital-converted, and then output.

Furthermore, the analog capture board 140 comprises reference signal input terminals 144-1 to 144-n to which a reference signal from a reference signal generator 300 is input, switches (relays) 145-1 to 145-n for switching between the input of the reference signal from the reference signal generator 300 and the input of the measurement signals from the devices under measurement, and D/A converters (DACs) 146-1 to 146-n for correcting the gains of the amplifiers 143-1 to 143-n.

In the image sensor tester having such a configuration, the reference signal generator (reference voltage source) 300 whose output voltage accuracy is high is prepared, and the output of this reference signal generator 300 is applied to the analog capture boards 140-1 to 140-n, thereby correcting the gains of the amplifiers 143-1 to 143-n so that the A/D conversion results in a desired value.

Although, in conventional image sensor testers, the gain of an amplifier provided in an analog capture board can be adjusted, there has been a problem that the gain of a buffer provided in a performance board can not be corrected.

Furthermore, there has been a problem that a voltage offset or timing offset of the buffer can not be corrected either.

SUMMARY OF THE INVENTION

The present invention has been made to solve the problems described above, and is directed to provide a semiconductor test apparatus and a performance board capable of correcting the gain, etc. of the buffer provided in the performance board.

In order to achieve this object, there is provided a semiconductor test apparatus of the present invention which includes: a capture board having an input terminal to which a measurement signal output from a device under measurement is input, and an amplifier circuit which amplifies the measurement signal input to the input terminal; a cable which sends the measurement signal from the device under measurement to the capture board; a buffer connected between the cable and the device under measurement to drive the cable; and a performance board on which the buffer is mounted, the semiconductor test apparatus comprising: a reference signal generator which applies a reference signal for calibration of the buffer across the device under measurement and the buffer.

When the semiconductor test apparatus has such a configuration, the reference signal from the reference signal generator is applied to the buffer provided in the performance board, so that the buffer can be calibrated.

Moreover, the applied reference signal is also applied to an amplifier on the capture board via the cable. Thus, the amplifier of the capture board can also be calibrated.

Furthermore, both the calibration of the buffer and the calibration of the amplifier can be carried out with one reference signal generator. That is, it is not necessary to uneconomically provide one reference signal generator for the calibration of the buffer and another reference signal generator for the calibration of the amplifier. Thus, a cost reduction can be achieved.

It is to be noted that the calibration of the buffer includes the correction of the gain of the buffer, the correction of a voltage offset of the buffer, and the correction of a timing offset of the buffer.

Furthermore, in the configuration of the semiconductor test apparatus of the present invention, the reference signal generator is a gain correcting reference signal generator which outputs a reference signal indicating a predetermined voltage value and then applies the reference signal to the buffer.

When the semiconductor test apparatus has such a configuration, the gain of the buffer provided in the performance board can be corrected.

Furthermore, in the configuration of the semiconductor test apparatus of the present invention, the reference signal generator is a voltage offset correcting reference signal generator which outputs a reference signal indicating a voltage value of 0 V and then applies the reference signal to the buffer.

When the semiconductor test apparatus has such a configuration, the voltage offset of the buffer provided in the performance board can be corrected.

Furthermore, in the configuration of the semiconductor test apparatus of the present invention, the reference signal generator is a timing offset correcting reference signal generator which outputs a signal having a phase of 0 and applies the reference signal to the buffer.

When the semiconductor test apparatus has such a configuration, the timing offset of the buffer provided in the performance board can be corrected.

Furthermore, the semiconductor test apparatus of the present invention comprises a switch which switches between the measurement signal from the device under measurement and the reference signal from the reference signal generator so that one of them is input to the buffer.

When the semiconductor test apparatus has such a configuration, the switch can be turned so that the reference signal from the reference signal generator can be input during the calibration while the measurement signal from the device under measurement can be input during a test of the device under measurement.

Furthermore, in the configuration of the semiconductor test apparatus of the present invention, the device under measurement is a charge coupled device or a complementary metal-oxide semiconductor constituting an image sensor.

When the semiconductor test apparatus has such a configuration, it is applicable to a semiconductor test apparatus which sets the image sensor of the charge coupled device (CCD) or the complementary metal-oxide semiconductor (CMOS) as a device under measurement.

Furthermore, a performance board of the present invention includes a buffer to which a cable to send a measurement signal output from a device under measurement to a capture board is connected and which is connected between the cable and the device under measurement to drive the cable, and the performance board comprises a reference signal generator which applies a reference signal for calibration of the buffer across the device under measurement and the buffer.

When the performance board has such a configuration, the reference signal from the reference signal generator is applied to the buffer provided in this performance board, so that the buffer can be calibrated.

Moreover, the applied reference signal is also applied to an amplifier of the capture board via the cable. Thus, both the buffer of the performance board and the amplifier of the capture board can be calibrated.

As described above, according to the present invention, the reference signal is applied to the buffer provided in the performance board, so that the buffer can be calibrated.

Furthermore, the reference signal is also applied to the amplifier on the capture board, so that the amplifier can also be calibrated.

Moreover, both the calibration of the buffer of the performance board and the calibration of the amplifier of the capture board can be carried out with one reference signal generator. Thus, a cost reduction can be achieved.

Furthermore, as the calibration, it is possible to carry out, for example, not only the correction of the gain of the buffer but also the correction of the voltage offset or the correction of the timing offset.

DETAILED DESCRIPTION OF THE PREFERRED EMBODIMENTS

Preferred embodiments of a semiconductor test apparatus and a performance board according to the present invention will hereinafter be described with reference to the drawings.

First Embodiment

Initially, a first embodiment of a semiconductor test apparatus and a performance board of the present invention will be described referring to FIG. 1.

Figure 1:
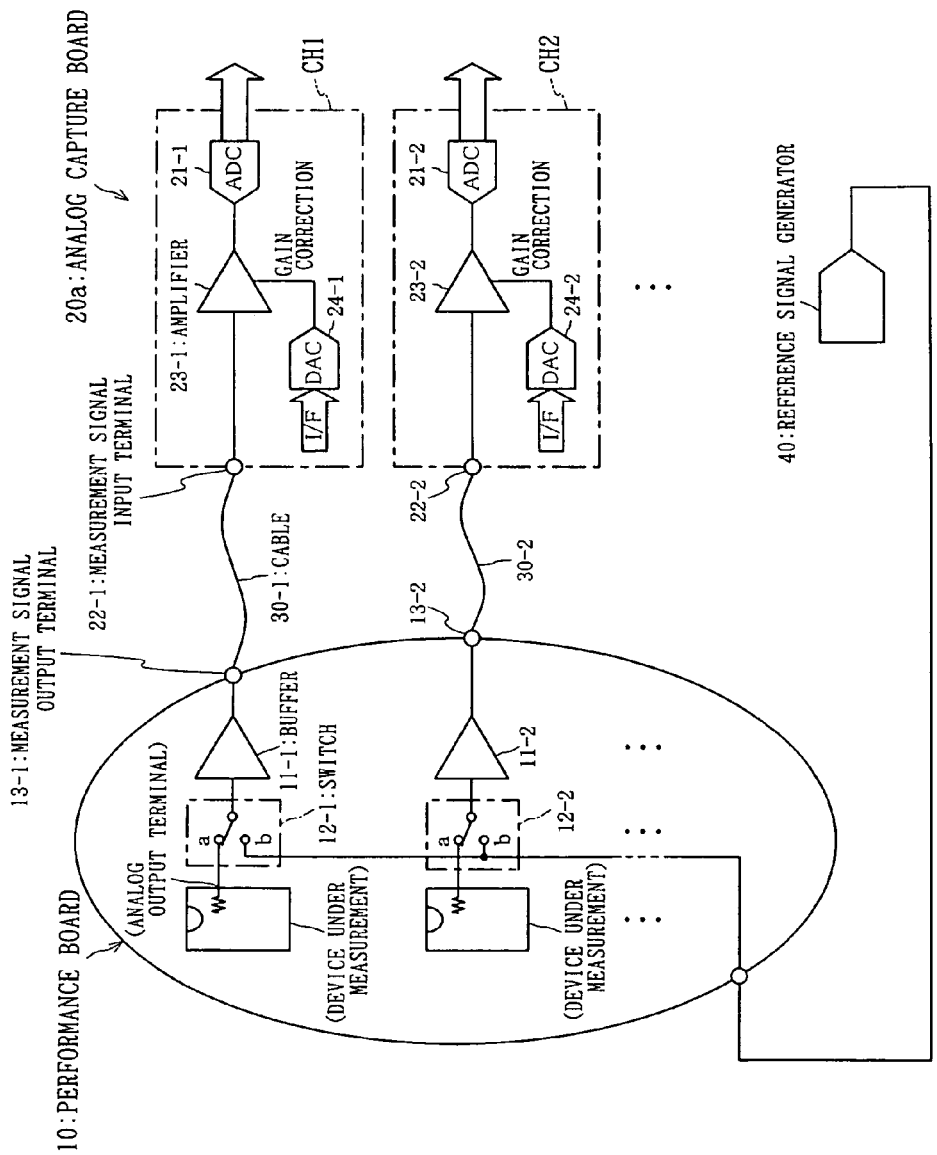
FIG. 1 is a circuit diagram showing the configuration of a semiconductor test apparatus in a first embodiment of the present invention.

FIG. 1 is a block diagram showing the configurations of a performance board and an analog capture board in the semiconductor test apparatus (image sensor tester) of the present embodiment.

As shown in FIG. 1, a semiconductor test apparatus (image sensor tester) 1a comprises a performance board 10, an analog capture board 20a, cables 30-1 to 30-n (hereinafter abbreviated as a "cable 30"), and a reference signal generator 40.

Here, the performance board 10 permits a device under measurement to be mounted thereon, and further comprises buffers 11-1 to 11-n (hereinafter abbreviated as a "buffer 11"), switches (relays) 12-1 to 12-n (hereinafter abbreviated as a "switch 12"), and measurement signal output terminals 13-1 to 13-n (hereinafter abbreviated as a "measurement signal output terminal 13").

The buffer 11 is connected to an analog output terminal of the device under measurement via the switch 12, and drives the cable 30 connected to the analog capture board 20a.

The switch 12 switches between a measurement signal from the device under measurement and a reference signal (reference voltage) from the reference signal generator 40 so that one of them is input to the buffer 11.

That is, a switch is turned, during calibration, to a terminal b to which the reference signal from the reference signal generator 40 is input, while a switch is turned, during a test of the device under measurement, to a terminal a to which the measurement signal from the device under measurement is input.

The number of analog capture boards 20a provided is the same as the number of devices under measurement that can be mounted on the performance board 10, and the analog capture boards 20a have A/D converters (ADCs) 21-1 to 21-n (hereinafter abbreviated as an "ADC 21"), measurement signal input terminals 22-1 to 22-n (hereinafter abbreviated as a "measurement signal input terminal 22"), amplifiers (amplifier circuits) 23-1 to 23-n (hereinafter abbreviated as an "amplifier 23"), and gain correcting D/A converters (DACs) 24-1 to 24-n (hereinafter abbreviated as a "DAC 24").

Figure 4:
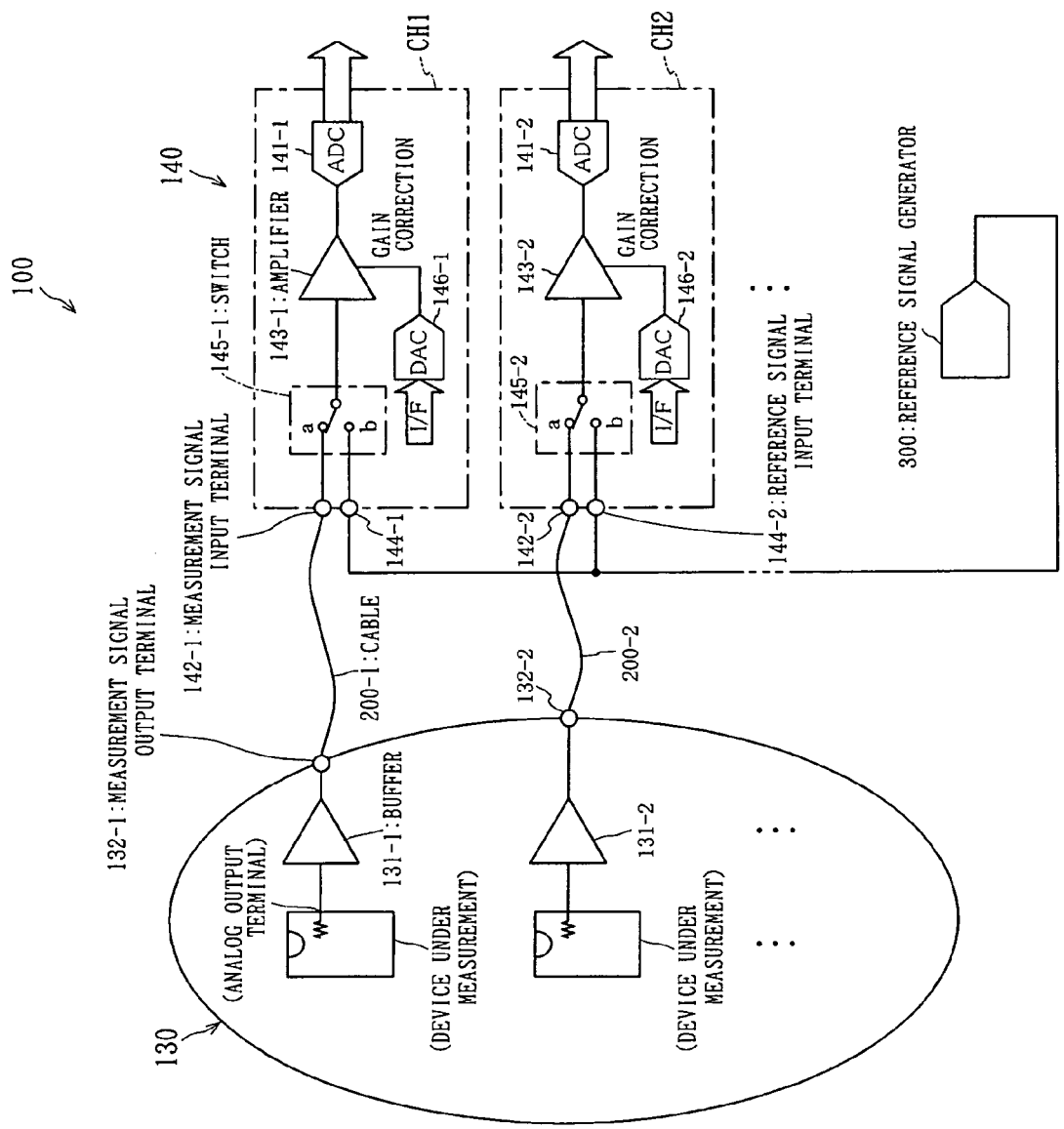
FIG. 4 is a circuit diagram showing the configurations of a performance board and analog capture boards in the conventional semiconductor test apparatus.

It is to be noted that the ADC 21, the measurement signal input terminal 22, the amplifier 23 and the DAC 24 have functions similar to those of A/D converters (ADCs) 141-1 to 141-n, measurement signal input terminals 142-1 to 142-n, amplifiers 143-1 to 143-n, and D/A converters (DACs) 146-1 to 146-n of an analog capture board 140 shown in FIG. 4, and these are not described in detail.

The cable 30 is connected between the performance board 10 (the measurement signal output terminal 13) and the analog capture board 20a (the measurement signal input terminal 22), and the cable 30 sends the measurement signals output from the analog output terminals of the devices under measurement to boards 20-1 to 20-n of corresponding channels (CHs) of the analog capture boards 20a.

The reference signal generator (gain correcting reference signal generator) 40 outputs a reference signal indicating a highly accurate voltage value. This output reference signal is applied to the buffer 11 via the terminal a of the switch 12 of the performance board 10, and is also applied to the amplifier 23 of the analog capture board 20a via the cable 30.

This reference signal generator 40 can be provided in the vicinity of or within the analog capture board 20a as shown in FIG. 1, or can also be provided in the vicinity of or within the performance board 10. When the reference signal generator 40 is provided in the vicinity of or within the performance board 10, the length of a wiring line to the switch 12 can be shorter than when the reference signal generator 40 is provided in the vicinity of or within the analog capture board 20a.

Next, a method of correcting the gain of the buffer in the semiconductor test apparatus of the present embodiment will be described with reference to FIG. 1.

First, during calibration, the switch 12 of the performance board 10 is turned to the terminal (terminal b) to which the reference signal of the reference signal generator 40 is input.

Subsequently, the reference signal is output from the reference signal generator 40 and applied to the buffer 11. Then, the gain of the buffer 11 is corrected so that an output after A/D conversion in the analog capture board 20a has a desired value.

Subsequently, the reference signal is also applied to the amplifier 23 of the analog capture board 20a. Thus, the gain of the amplifier 23 is corrected so that an output after A/D conversion in the analog capture board 20a has a desired value.

When the calibration is finished, the switch 12 is turned to the terminal (terminal a) to which the measurement signal output from the analog output terminal of the device under measurement is input. Thus, a performance test of the device under measurement is carried out.

According to the semiconductor test apparatus and the performance board described above, the reference signal output from the reference signal generator is applied to the buffer provided in the performance board, so that the gain of the buffer can be corrected.

Moreover, not only the gain of the buffer but also the gain of the amplifier provided in the analog capture board can be corrected.

Furthermore, both the gain of the buffer provided in the performance board and the gain of the amplifier provided in the analog capture board can be corrected with one reference signal generator. Thus, the costs of the semiconductor test apparatus can be reduced.

Second Embodiment

Next, a second embodiment of a semiconductor test apparatus and a performance board of the present invention will be described referring to FIG. 2.

Figure 2:
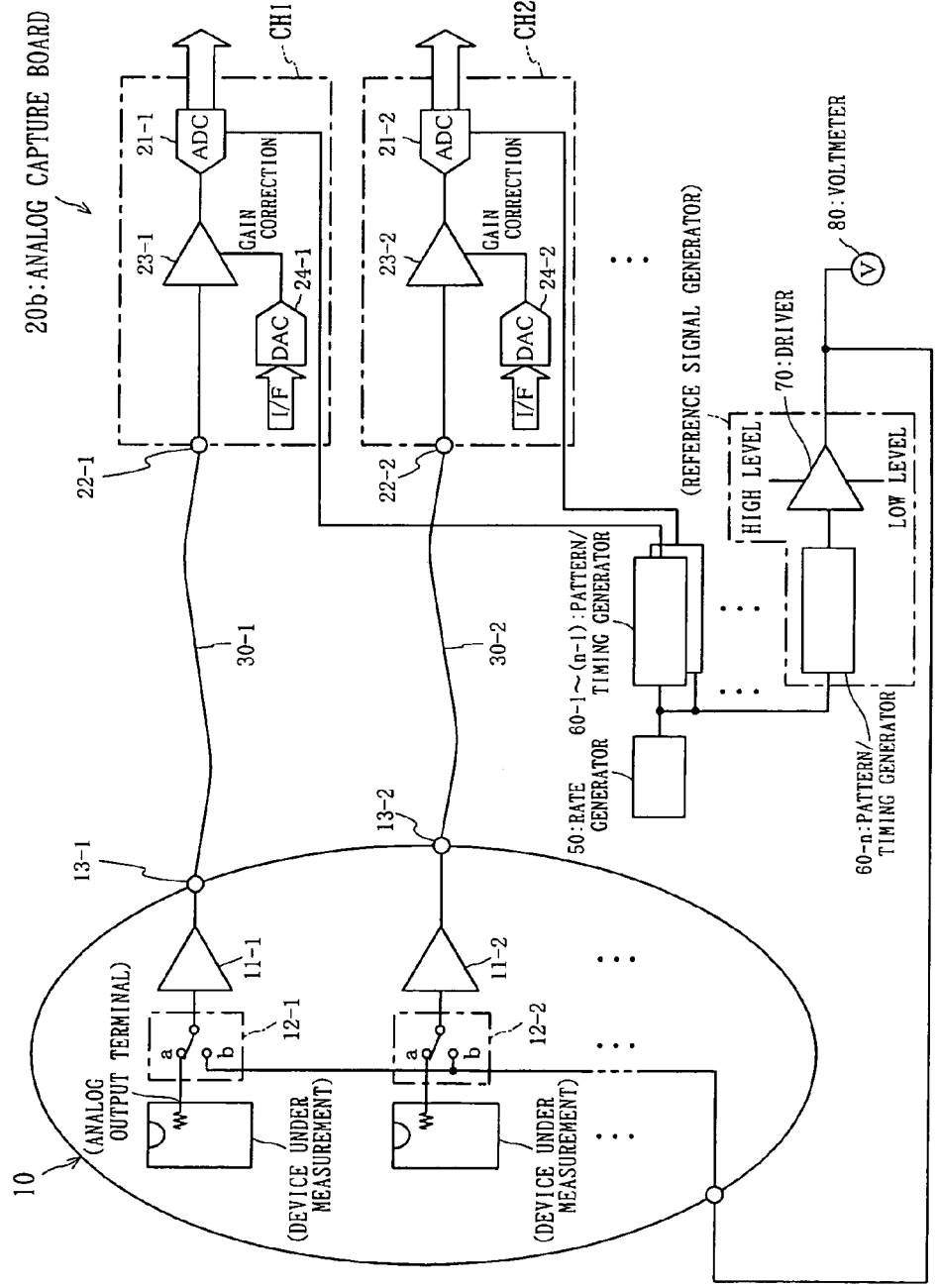
FIG. 2 is a circuit diagram showing the configuration of a semiconductor test apparatus in a second embodiment of the present invention.
Figure 3:
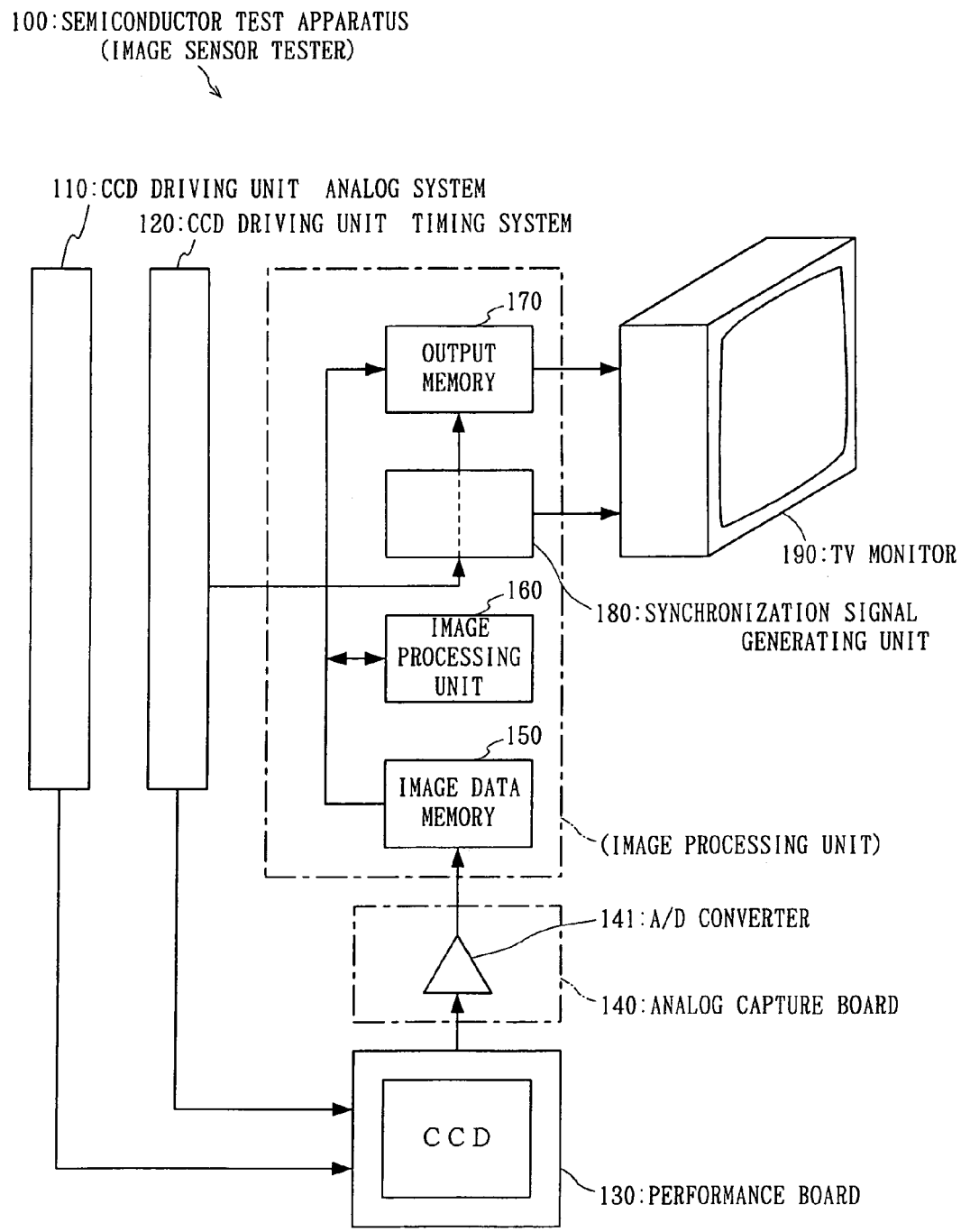
FIG. 3 is a circuit diagram showing the configuration of a conventional semiconductor test apparatus.

FIG. 2 is a block diagram showing the configuration of the semiconductor test apparatus in the present embodiment.

The present embodiment is different from the first embodiment in the configuration of the semiconductor test apparatus adapted to the contents of calibration. That is, in the first embodiment, the contents of the calibration include correcting the gain of the buffer provided in the performance board, and the configuration of the semiconductor test apparatus is adapted to such contents. Contrarily, in the present embodiment, the contents of the calibration include correcting a voltage offset and timing offset caused in the buffer, and the configuration of the semiconductor test apparatus is adapted to such contents. Other components are similar to those in the first embodiment.

Therefore, in FIG. 2, the same signs are assigned to the components similar to those in FIG. 1, and these components are not described in detail.

As shown in FIG. 2, a semiconductor test apparatus (image sensor tester) 1b comprises a performance board 10, an analog capture board 20b, a cable 30, a RATE generator 50, pattern/timing generators 60-1 to 60-n, a reference signal driver 70, and a voltmeter 80.

Here, the analog capture board 20b has an A/D converter (ADC) 21, a measurement signal input terminal 22, an amplifier (amplifier circuit) 23, a gain correcting D/A converter (gain correcting DAC) 24, and offset correcting D/A converters (offset correcting DACs) 25-1 to 25-n (hereinafter abbreviated as an "offset correcting DAC 25".).

The offset correcting DAC 25 is used when the voltage offset caused in a buffer 11 of the performance board 10 is corrected, and adjusts an output value of the analog capture board 20b so that it coincides with a measured value in the voltmeter 80.

The RATE generator 50 outputs a RATE signal to bring into coincidence the output timings of calibration test signals output from the pattern/timing generators 60-1 to 60-n, and sends the RATE signal to each of the pattern/timing generators 60-1 to 60-n.

The pattern/timing generators 60-1 to 60-n include first pattern/timing generators 60-1 to 60-(n−1) for sending the calibration test signals to the analog capture board 20b, and a second pattern/timing generator 60-n for outputting the reference signal.

The first pattern/timing generators 60-1 to 60-(n−1) change the phase of a signal and search the edge of the reference signal when correcting the timing offset.

The second pattern/timing generator 60-n generates a reference signal when the voltage offset or the timing offset are corrected.

The reference signal driver 70 outputs the reference signal generated in the second pattern/timing generator 60-n. This reference signal is applied to the buffer 11 via a terminal b of a switch 12 of the performance board 10.

The RATE generator 50, the pattern/timing generators 60-1 to 60-n, the driver 70 and the voltmeter 80 can be provided in the vicinity of or within the analog capture board 20b, or can be provided in the vicinity of or within the performance board 10.

It is to be noted that the second pattern/timing generator 60-n and the reference signal driver 70 are collectively called a "reference signal generator" in the present embodiment.

Furthermore, when the voltage offset of the buffer 11 is corrected, the second pattern/timing generator 60-n and the reference signal driver 70 function as a "voltage offset correcting reference signal generator".

Moreover, when the timing offset of the buffer 11 is corrected, the second pattern/timing generator 60-n and the reference signal driver 70 function as a "timing offset correcting reference signal generator".

The voltmeter 80 measures the value of a voltage output from the reference signal driver 70 when the voltage offset is corrected. This measured value is compared with an output value of the analog capture board 20b, and the voltage offset is adjusted so that the measured value coincides with the output value.

Next, the procedure of correcting the voltage offset in the semiconductor test apparatus of the present embodiment will be described referring to FIG. 2.

In this correction of the voltage offset, the voltage offset caused in the buffer 11 provided in the performance board 10 is corrected.

First, the switch 12 of the performance board 10 is turned to the terminal b.

Subsequently, a LOW level (0V) is set in the pattern/timing generator 60-n corresponding to the reference signal driver 70, and its output voltage is measured in the voltmeter 80. The result of this measurement is V1.

Then, the output voltage is applied to the buffer 11 via the terminal b of the switch 12 as a reference signal, and loaded into the analog capture board 20b via the cable 30.

Subsequently, the offset correcting DAC 25 is adjusted so that the output value of the analog capture board 20b coincides with V1. Thus, the voltage offset caused in the buffer 11 is corrected.

Next, the operation of correcting the timing offset in the semiconductor test apparatus of the present embodiment will be described referring to FIG. 2.

In this correction of the timing offset, the timing offset caused in the buffer 11 provided in the performance board 10 is corrected.

First, the switch 12 of the performance board 10 is turned to the terminal b.

Subsequently, a square wave having a zero phase is generated in the pattern/timing generator 60-n, and output from the reference signal driver 70. A signal of this output square wave is applied to the buffer 11 via the terminal b of the switch 12 as a reference signal, and loaded into the analog capture board 20b via the cable 30.

The phase thereof is changed for each channel of the analog capture board 20b by the corresponding pattern/timing generators 60-1 to 60-n(n−1), and the edge of the reference signal is searched.

A phase obtained by this search is stored. This stored phase serves as a reference when an A/D converter clock of each channel is set.

As described above, according to the semiconductor test apparatus and the performance board of the present embodiment, the reference signal output from the pattern/timing generator which is the reference signal generator is applied to the buffer on the performance board, so that the voltage offset or timing offset of the buffer can be corrected.

While the preferred embodiments of the semiconductor test apparatus and the performance board of the present invention have been described above, it should be understood that the semiconductor test apparatus and the performance board according to the present invention are not exclusively limited to the embodiments described above, and various modifications can be made within the scope of the present invention.

For example, a plurality of devices under measurement, buffers and channels of the analog capture board, etc. are provided in the configurations in the embodiments described above, but the present invention is not limited to a plurality of devices under measurement, etc., and only one device under measurement, etc. may be provided.

Furthermore, other than the configurations shown in FIGS. 1 and 2, it is also possible to employ, for example, a method in which the output of the ADC is logically controlled (calculated from the output value of the ADC).

Moreover, when the accuracy of the output voltage of the reference signal generator is not sufficient, this voltage can be measured so that a measured value serves as a true value.

The present invention concerns the calibration of a buffer connected between a device under measurement on a performance board and a cable, and can therefore be used in a performance board equipped with a buffer or to a semiconductor test apparatus having this performance board.

What is claimed is:

1. A semiconductor test apparatus for testing a semiconductor device, comprising:
   a capture board having an input terminal to which a measurement signal output from a device under measurement is input, and an amplifier circuit which amplifies the measurement signal input to the input terminal;
   a cable which sends the measurement signal from the device under measurement to the capture board;
   a buffer connected between the cable and the device under measurement to drive the cable;
   a performance board on which the buffer is mounted;
   a reference signal generator which applies a reference signal for calibration of the buffer across the device under measurement and the buffer; and
   a switch which switches between the measurement signal from the device under measurement and the reference signal from the reference signal generator so that one of them is input to the buffer.

2. The semiconductor test apparatus according to claim 1, wherein the reference signal generator is a gain correcting reference signal generator which outputs a reference signal indicating a predetermined voltage value and then applies the reference signal to the buffer.

3. The semiconductor test apparatus according to claim 1, wherein the reference signal generator is a voltage offset correcting reference signal generator which outputs a reference signal indicating a voltage value of 0 V and then applies the reference signal to the buffer.

4. The semiconductor test apparatus according to claim 1, wherein the reference signal generator is a timing offset correcting reference signal generator which outputs a signal having a phase of 0 and applies the reference signal to the buffer.

5. The semiconductor test apparatus according to claim 1, wherein the device under measurement is a charge coupled device or a complementary metal-oxide semiconductor constituting an image sensor.

* * * * *